(12) United States Patent
Yamada et al.

(10) Patent No.: US 10,522,705 B2
(45) Date of Patent: *Dec. 31, 2019

(54) SOLAR CELL AND SOLAR CELL MODULE

(71) Applicant: Panasonic Intellectual Property Management Co., Ltd., Osaka (JP)

(72) Inventors: Hiroyuki Yamada, Osaka (JP); Ayumu Yano, Osaka (JP); Minato Seno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/445,225

(22) Filed: Jun. 19, 2019

(65) Prior Publication Data

US 2019/0305155 A1 Oct. 3, 2019

Related U.S. Application Data

(63) Continuation of application No. 15/418,782, filed on Jan. 30, 2017.

(30) Foreign Application Priority Data

Feb. 1, 2016 (JP) .................................. 2016-017417

(51) Int. Cl.
*H01L 31/0747* (2012.01)
*H01L 31/028* (2006.01)
(Continued)

(52) U.S. Cl.
CPC ...... *H01L 31/0747* (2013.01); *H01L 31/0203* (2013.01); *H01L 31/028* (2013.01); *H01L 31/032* (2013.01); *H01L 31/0376* (2013.01); *H01L 31/022466* (2013.01); *H01L 31/048* (2013.01); *Y02E 10/50* (2013.01); *Y02E 10/547* (2013.01); *Y02E 10/548* (2013.01)

(58) Field of Classification Search
CPC . H01L 31/028; H01L 31/0376; H01L 31/048; H01L 31/0747; Y02E 10/50; Y02E 10/547; Y02E 10/548
See application file for complete search history.

(56) References Cited

U.S. PATENT DOCUMENTS

2001/0032664 A1 10/2001 Takehara et al.
2003/0168578 A1 9/2003 Taguchi et al.
(Continued)

FOREIGN PATENT DOCUMENTS

JP 2003-324209 A 11/2003

OTHER PUBLICATIONS

The Extended European search report dated Jun. 8, 2017 in a counterpart European patent application No. 17153797.0.
(Continued)

*Primary Examiner* — Lindsey A Bernier
(74) *Attorney, Agent, or Firm* — Metrolex IP Law Group, PLLC

(57) ABSTRACT

In one or more embodiments, a solar cell may include: a silicon substrate, which is crystalline; a p-doped silicon oxide layer, which may be disposed on a first principal surface of the silicon substrate and may include phosphorus as an impurity; and an amorphous silicon layer, which may be disposed on the p-doped silicon oxide layer.

19 Claims, 5 Drawing Sheets

(51) Int. Cl.

| | | |
|---|---|---|
| *H01L 31/0376* | (2006.01) | |
| *H01L 31/0203* | (2014.01) | |
| *H01L 31/032* | (2006.01) | |
| *H01L 31/048* | (2014.01) | |
| *H01L 31/0224* | (2006.01) | |

(56) References Cited

U.S. PATENT DOCUMENTS

| | | |
|---|---|---|
| 2003/0227017 A1 | 12/2003 | Yasuno |
| 2009/0084425 A1* | 4/2009 | Milshtein .............. H01L 31/072 136/244 |
| 2011/0272012 A1 | 11/2011 | Heng et al. |
| 2012/0000506 A1 | 1/2012 | Nam et al. |
| 2012/0100665 A1 | 4/2012 | Li et al. |
| 2012/0152330 A1 | 6/2012 | Nakatani et al. |
| 2013/0000722 A1 | 1/2013 | Yamada et al. |
| 2014/0224313 A1 | 8/2014 | Wu et al. |
| 2015/0280031 A1 | 10/2015 | Smith |

OTHER PUBLICATIONS

Kaining Ding et al., "Wide Gap Microcrystalline Silicone Oxide Emitter for a-SiOx:H/c-Si Heterojunction Solar Cells", Japanese Journal of Applied Physics, published online on Dec. 3, 2013, vol. 52, pp. 122304-1 to 122304-5; in PTO-892 mailed on Oct. 26, 2017 in a parent U.S. Appl. No. 15/418,782.

* cited by examiner

SOLAR CELL AND SOLAR CELL MODULE

CROSS REFERENCE TO RELATED APPLICATION

This application is a continuation of U.S. patent application Ser. No. 15/418,782, filed on Jan. 30, 2017, which is based upon and claims the benefit of priority from the prior Japanese Patent Application No. 2016-017417, filed on Feb. 1, 2016, the entire contents of all of which are incorporated herein by reference.

BACKGROUND

1. Technical Field

The present disclosure relates to a solar cell and a solar cell module.

2. Description of the Related Art

Hybrid solar cells having a heterojunction structure of a crystalline semiconductor substrate and an amorphous semiconductor thin film are in practical use.

Patent Literature (PTL) 1 (Japanese Unexamined Patent Application Publication No. 2003-324209) discloses a photovoltaic device which improves interface characteristics between a crystalline semiconductor substrate and an amorphous semiconductor thin film to improve photoelectric conversion characteristics. Specifically, in the photovoltaic device disclosed by PTL 1, a p-type amorphous silicon thin film is laminated above a first principal surface of an n-type single-crystal silicon substrate with a first i-type amorphous silicon thin film being between the n-type single-crystal silicon substrate and the p-type amorphous silicon thin film. On the other hand, an n-type amorphous silicon thin film is laminated above a second principal surface of the n-type single-crystal silicon substrate with a second i-type amorphous silicon thin film being between the n-type single-crystal silicon substrate and the n-type amorphous silicon thin film. In the above configuration, after the second principal surface of the single-crystal silicon substrate is plasma-treated by plasma discharge using a mixed gas of a hydrogen gas and a gas including phosphorus on the second principal surface of the single-crystal silicon substrate, the second i-type amorphous silicon layer is formed. With this, phosphorus is introduced into an interface between the single-crystal silicon substrate and the second i-type amorphous silicon layer.

The above configuration makes it possible to reduce recombination of charge carriers in a semiconductor junction interface between the crystalline semiconductor substrate and the amorphous semiconductor thin film, improve junction characteristics, and to improve the photoelectric conversion characteristics of open-circuit voltage (Voc) etc.

SUMMARY

In the above conventional photovoltaic device, introducing phosphorus into the second principal surface of the n-type single-crystal silicon substrate causes defects in the second principal surface. These defects in the second principal surface of the single-crystal silicon substrate make it impossible to completely reduce recombination of charge carriers in the second i-type amorphous silicon layer, and there is concern that photoelectric conversion characteristics are deteriorated.

In view of this, the present disclosure has been conceived to solve the above problem, and an object of the present disclosure is to provide a solar cell having improved photoelectric conversion characteristics and a heterojunction structure, and a solar cell module.

In order to solve the above problem, a solar cell according to one aspect of the present disclosure includes: a silicon substrate which is crystalline; a first silicon oxide layer which is disposed on a first principal surface of the silicon substrate and includes phosphorus as an impurity; and a first amorphous silicon layer disposed on the first silicon oxide layer.

The silicon oxide layer including phosphorus as the impurity is between the silicon substrate which is crystalline and the amorphous silicon layer in the solar cell or solar cell module according to one aspect of the present disclosure. Consequently, it is possible to provide the solar cell with improved photoelectric conversion or the solar cell module with improved power generation efficiency.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF EMBODIMENTS

Hereinafter, a solar cell and a solar cell module according to one or more exemplary embodiments will be described in detail with reference to the drawings. The exemplary embodiments described herein below are directed to a specific example or examples. Therefore, numerical values, shapes, materials, structural components, the arrangement and connection of the structural components, and steps, etc. described in the following exemplary embodiments and shown in the figures are examples, and are not intended to limit the scope of the present disclosure. Accordingly, some structural components may be described herein below in the following exemplary embodiments, but may not be recited in any one of the independent claims Such cases may be intended to indicate the broadest concepts, and any structures omitted from the independent claims may refer to arbitrary structural components.

The respective figures are schematic diagrams and are not necessarily precise illustrations. In addition, in the respective figures, identical structural components are given the same reference signs.

In the present description, a "front surface" of a solar cell denotes a surface into which more light may enter inwardly in comparison to a "back surface" which is a surface opposite the front surface (at least 50 to 100% of light enters inwardly from the front surface). Examples of a front surface include a surface into which no light enters inwardly from a "back surface" side. In addition, a "front surface" of a solar cell module denotes a surface into which light on a side opposite the "front surface" of the solar cell may enter, and a "back surface" of the solar cell module denotes a surface opposite the front surface of the solar cell module. Unless specifically otherwise limited, an expression such as "provide a second member on a first member" is not intended to refer only to a condition in which the first and second members are provided in direct contact with each other. In other words, the expression "provide a second member on a first member" may refer to a condition in which another member is between the first and second members. Moreover, the expression "substantially," for example, "substantially the same" is intended to refer not only to a condition in which the described or recited quantities are exactly the same but also a condition where the recited quantities are not exactly the same but would be recognized as being effectively the same.

1. Configuration of Solar Cell Module

An exemplary plane configuration of a solar cell module in accordance with one or more embodiments will be described with reference to FIG. 1.

Figure 1:
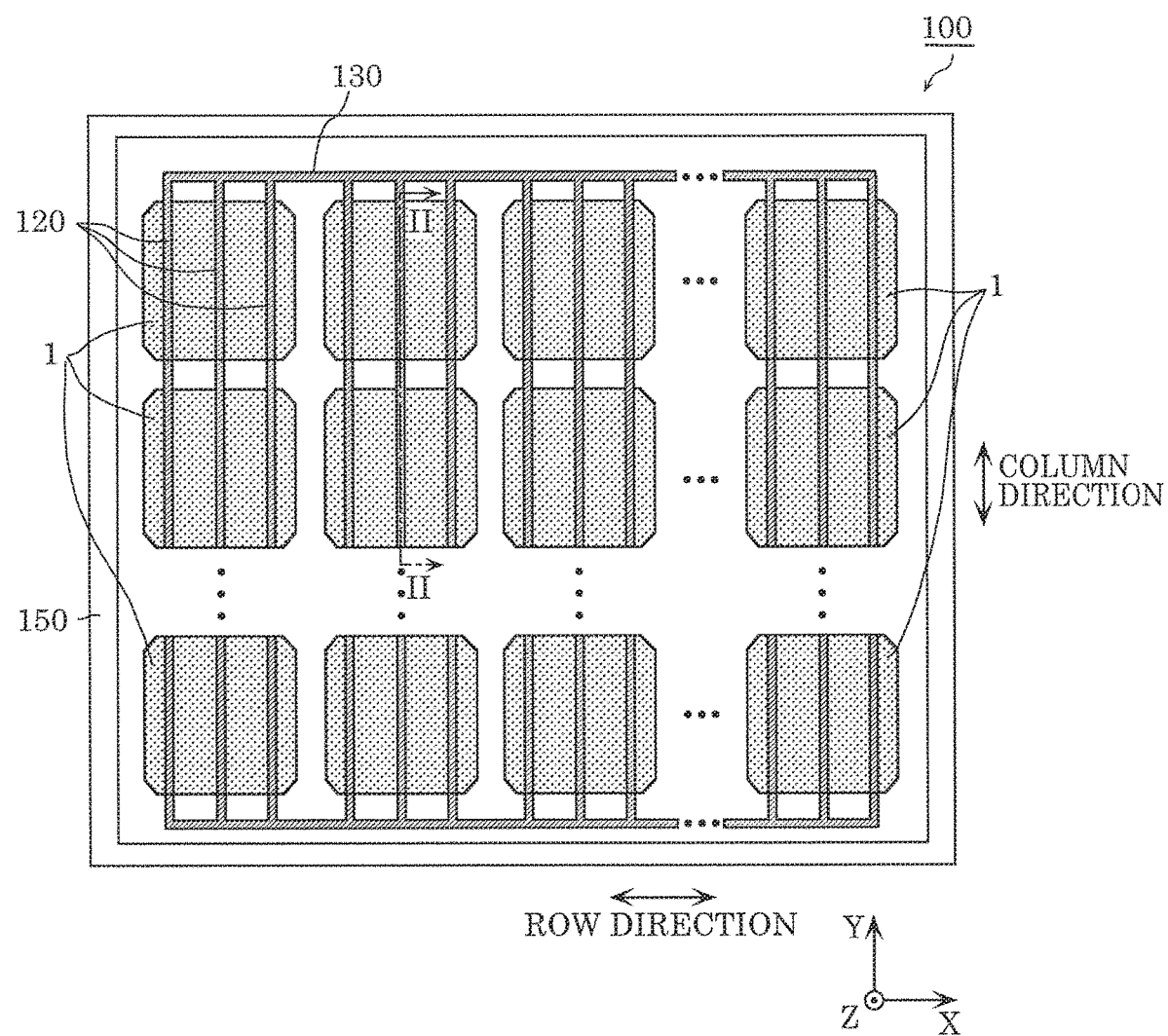
FIG. 1 is a diagram illustrating a schematic plan view of a solar cell module in accordance with one or more embodiments.
Figure 2:
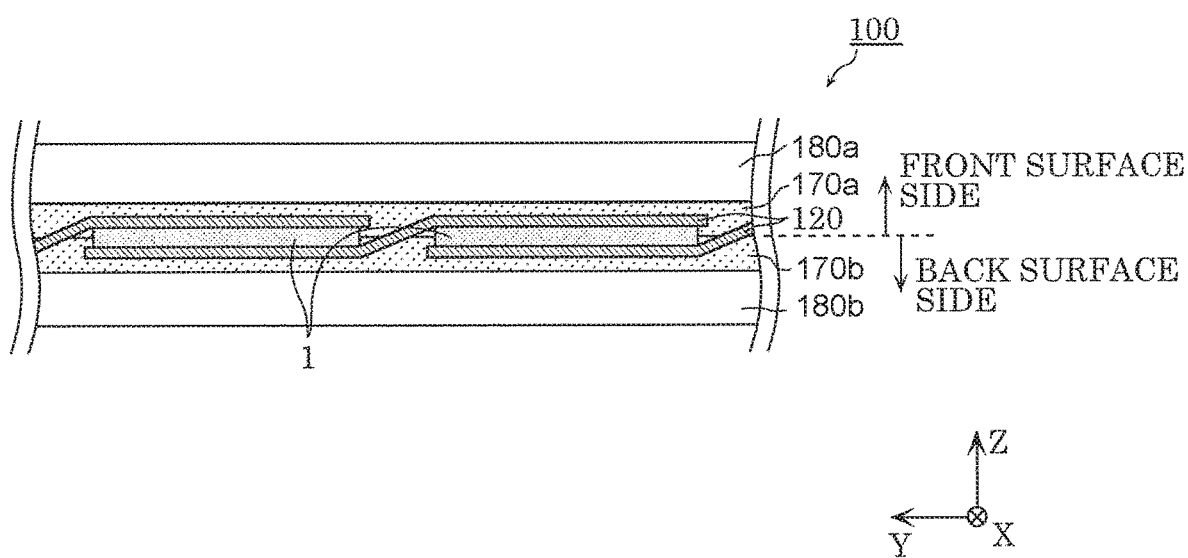
FIG. 2 is a diagram illustrating a structural cross-sectional view of the solar cell module in accordance with one or more embodiments, in a column direction.

FIG. 1 is a diagram illustrating a schematic plan view of a solar cell module 100 in accordance with one or more embodiments. FIG. 2 is a diagram illustrating a structural cross-sectional view of the solar cell module 100 in accordance with one or more embodiments, in a column direction. Specifically, FIG. 2 is a cross-sectional view of the section II-II of the solar cell module 100, e.g., as may be shown in FIG. 1.

As illustrated in FIG. 1, solar cell module 100 includes solar cells 1, tab lines 120, connecting lines 130, and a frame 150. In addition, as illustrated by FIG. 2, solar cell module 100 further includes a front surface encapsulant member 170a, a back surface encapsulant member 170b, a front surface protective member 180a, and a back surface protective member 180b.

The solar cells 1 are planar photovoltaic elements which may be arranged in a matrix on a light-receiving surface and generate electric power in response to light irradiation.

Each of the tab lines 120 is a line member which is disposed on a front surface of each of the solar cells 1 and electrically connects neighboring ones of the solar cells 1 in the column direction. The tab line 120 is a ribbon metal foil, for example. The tab line 120 may be produced, for example, by cutting, into strips having a predetermined length, a metal foil such as a copper foil and a silver foil whose entire surface is covered with solder, silver, etc.

Each of the connecting lines 130 is a line member connecting solar cell strings. Each of the solar cell strings is an aggregate of cells of the solar cells 1 arranged in the column direction and connected by tab line 120.

The frame 150 is an outer frame member which covers an outer periphery of a panel on which the solar cells 1 are two-dimensionally arrayed.

A light diffusion member may be disposed between neighboring ones of the solar cells 1. The light diffusion member may cause light entering a gap region between solar cells 1 to be redistributed to the solar cells 1, and thus light gathering efficiency of each of the solar cells 1 is increased. Accordingly, it is possible to increase overall photoelectric conversion efficiency of the solar cell module.

As illustrated by FIG. 2, in which two cells of the solar cells 1 neighbor each other in the column direction, the tab line 120 is disposed on a front surface of one of two cells of the solar cells 1 is also disposed on a back surface of the other of the two cells of the solar cells 1. More specifically, a back surface at one end portion of the tab line 120 is bonded to a bus bar electrode on the front surface of the one of the two cells of the solar cells 1, and a front surface at the other end portion of the table line 120 is bonded to a bus bar electrode on the back surface of the other of the two cells of the solar cells 1.

In an example, the tab line 120 and the bus bar electrode are bonded with an electrically conductive adhesive. Examples of the electrically conductive adhesive may include a conductive adhesive paste, a conductive adhesive film, and an anisotropic conductive film. In further examples, the electrically adhesive paste may be a paste adhesive produced by dispersing conductive particles into a thermosetting adhesive resin material such as an epoxy resin, an acryl resin, and a urethane resin. Each of the electrically conductive adhesive film and the anisotropic conductive film may be a film adhesive produced by dispersing conductive particles into a thermosetting adhesive resin material.

The aforementioned electrically conductive adhesive may be a solder material. Alternatively, or in addition, a resin adhesive including no conductive particles may be used instead of the electrically conductive adhesive. In a condition in which no conductive particles are used, an application thickness for the resin adhesive should be suitably selected to allow the resin adhesive to soften when pressure is applied at the time of thermal compression bonding, such that the bus bar electrode and the tab line 120 may be electrically connected in direct contact with each other.

Moreover, as illustrated in FIG. 2, the front surface protective member 180a is provided on a front surface side of each of the cells of the solar cells 1, and the back surface protective member 180b is provided on a back surface side of each of the cells of the solar cells 1. The front surface encapsulant member 170a is disposed between a surface including the cells of the solar cells 1 and the front surface protective member 180a, and the back surface encapsulant member 170b is disposed between a surface including the cells of the solar cells 1 and the back surface protective member 180b. The front surface protective member 180a and the back surface protective member 180b are fixed by the front surface encapsulant member 170a and the back surface encapsulant member 170b, respectively.

The front surface protective member 180a is a translucent substrate which protects a front surface side of the solar cell module 100, and protects the inside (cells of the solar cells 1 etc.) of the solar cell module 100 from an external environment such as wind and rain, external shock, and fire. The front surface protective member 180a is a translucent member having translucency, and is a glass substrate (transparent glass substrate) including a transparent glass material or a resin substrate including a film-like or plate-like hard resin material having translucency and impermeability, for example.

The back surface protective member 180b is a member which protects a back surface of the solar cell module 100 and includes, for example, a resin film such as polyethylene terephthalate or a laminated film having a structure in which an Al foil is disposed between resin films.

The front surface encapsulant member 170a and the back surface encapsulant member 170b have a sealing function for isolating the cells of the solar cells 1 from the external environment. Disposing the front surface encapsulant member 170a and the back surface encapsulant member 170b in a sealing capacity makes it possible to ensure high heat resistance and high humidity resistance when the solar cell module 100 is to be installed outdoors.

Each of the front surface encapsulant member 170a and the back surface encapsulant member 170b includes a translucent polymer material having a sealing function. Examples of the polymer material of the front surface encapsulant member 170a include a translucent resin material such as ethylene-vinyl acetate (EVA).

In order to simplify a manufacturing process and to promote interface adherence between the front surface encapsulant member 170a and the back surface encapsulant member 170b, the front surface encapsulant member 170a and the back surface encapsulant member 170b may include the same material.

2. Structure of Solar Cell

The following describes a structure of each solar cell 1 of the solar cells 1, which is a main component of the solar cell module 100.

Figure 3:
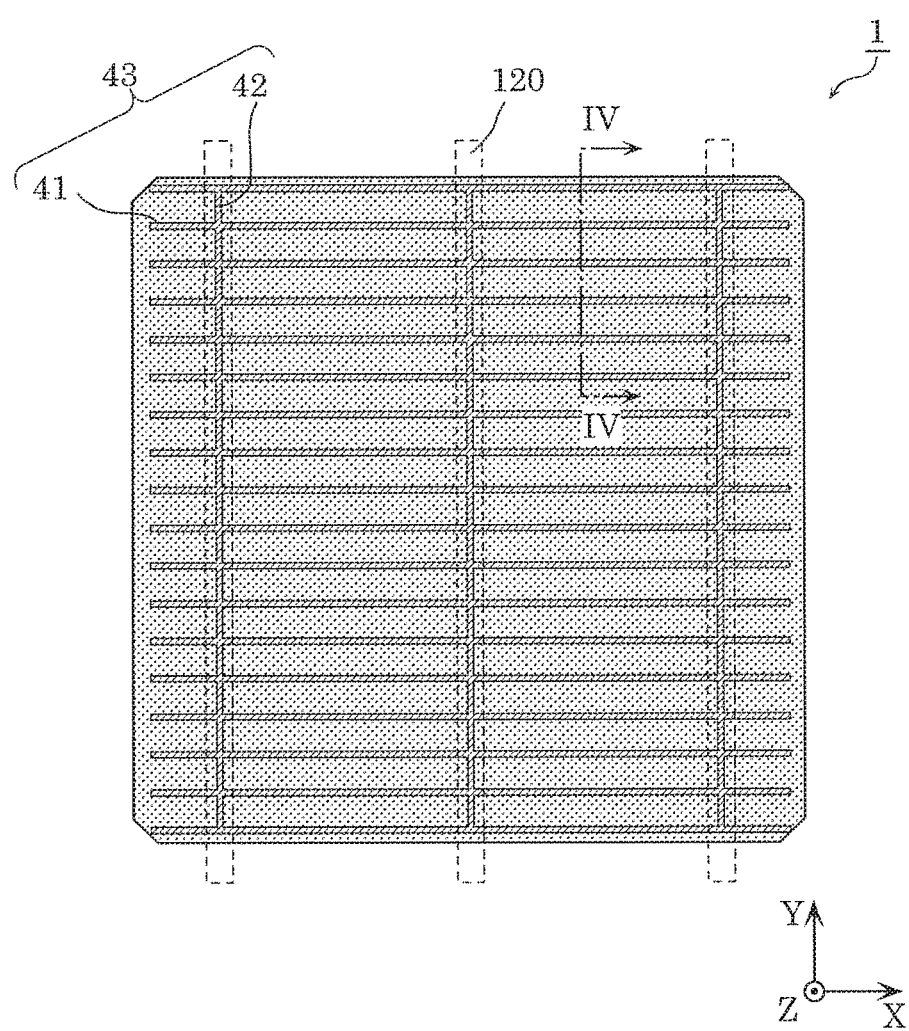
FIG. 3 is a diagram illustrating a plan view of a solar cell in accordance with one or more embodiments.

FIG. 3 is diagram illustrating a plan view of the solar cell 1 in accordance with one or more embodiments. As illustrated by the figure, the solar cell 1 may be substantially square in a plan view. In one example, the solar cell 1 has a size of 125 mm in length×125 mm in width×200 μm in thickness. Moreover, on a surface of the solar cell 1, the bus bar electrodes 42 having a stripe shape are formed in parallel to each other, and the finger electrodes 41 having a stripe shape are formed in parallel to each other to cross the bus bar electrodes 42 at right angles. The bus bar electrodes 42 and the finger electrodes 41 constitute a collector electrode 43. The collector electrode 43 is formed using, for example, a conductive paste including conductive particles such as Ag (silver). In an example, a line width of the bus bar electrodes 42 is 1.5 mm, a line width of the finger electrodes 41 is 100 μm, and a pitch of the finger electrodes 41 is 2 mm. Furthermore, the tab lines 120 are bonded onto the bus bar electrodes 42.

Figure 4:
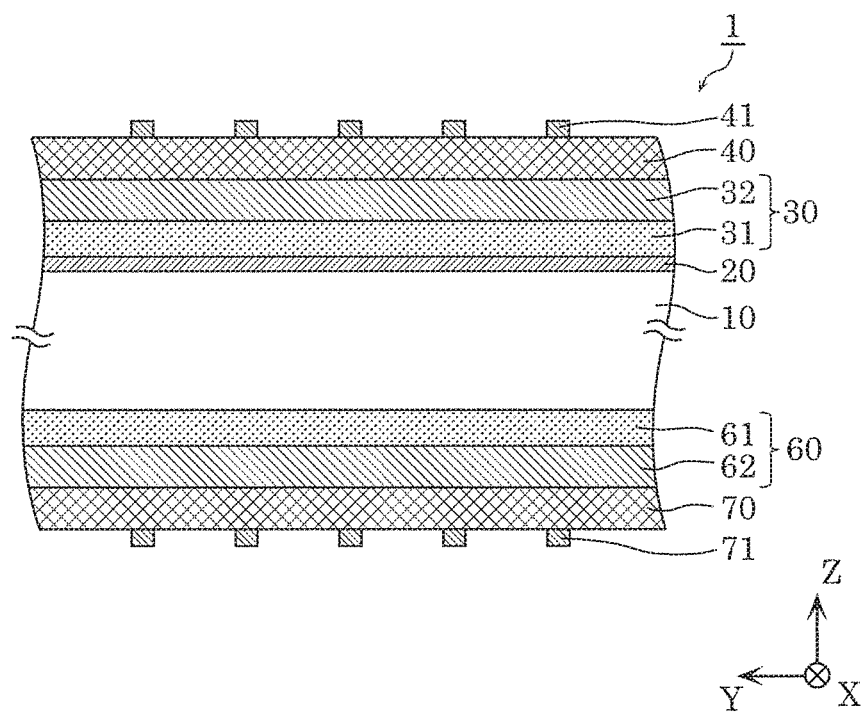
FIG. 4 is a diagram illustrating a schematic cross-sectional view of a laminated structure of the solar cell in accordance with one or more embodiments.

FIG. 4 is a diagram illustrating a schematic cross-sectional view of a laminated structure of the solar cell 1 in accordance with one or more embodiments. FIG. 4 is a cross-sectional view of section IV-IV of the solar cell 1, e.g., as may be shown in FIG. 3. As illustrated in FIG. 4, the solar cell 1 may include a silicon substrate 10, a p-doped silicon oxide layer 20, amorphous silicon layers 30 and 60, transparent electrodes 40 and 70, and finger electrodes 41 and 71. For brevity, FIG. 4 illustrates only finger electrode 41 included in the collector electrode 43.

The silicon substrate 10 is an n-type single-crystal silicon substrate having a first principal surface and a second principal surface that are in back-to-back relation with each other. The silicon substrate 10 may include polysilicon. Moreover, each of the first principal surface and the second principal surface may have a textured structure in which pyramids are two-dimensionally arranged. Furthermore, the silicon substrate 10 has an n-type dopant concentration of at least $3\times10^{14}/cm^3$ and at most $9.1\times10^{15}/cm^3$, for example, and a resistivity of at least 0.5 Ωcm and at most 15 Ωcm, for example. In addition, the silicon substrate 10 has an n-type dopant concentration of at most $3\times10^{15}/cm^3$, and a resistivity of at least 1.5 Ωcm in order to further reduce the recombination of charge carriers. Additionally, in order to reduce output loss caused by series resistance, silicon substrate 10 has an n-type dopant concentration of at least $3.5\times10^{14}/cm^3$, and a resistivity of at most 13 Ωcm.

The p-doped silicon oxide layer 20 is a first silicon oxide layer disposed on the first principal surface of the silicon substrate 10, and includes a silicon oxide film including phosphorus as an impurity. In an example, the p-doped silicon oxide layer 20 has a thickness of at least 0.1 nm and at most 3 nm. The p-doped silicon oxide layer 20 may further have a thickness of at most 2 nm. The p-doped silicon oxide layer 20 is thinner than a dielectric layer 31 and an n-type amorphous silicon layer 32, to be described in greater detail hereafter. In addition, the p-doped silicon oxide layer 20 may be formed into an island shape, in an interface between the silicon substrate 10 and the amorphous silicon layer 30.

The p-doped silicon oxide layer 20 has a phosphorus concentration of at least $1\times10^{19}/cm^3$ and at most $5\times10^{20}/cm^3$, and an oxygen atomic concentration of at least $1\times10^{21}/cm^3$ and at most $2\times10^{22}/cm^3$. The p-doped silicon oxide layer 20 more preferably has a phosphorus concentration of at least $5\times10^{19}/cm^3$ and at most $1\times10^{20}/cm^3$, and an oxygen atomic concentration of at least $2\times10^{21}/cm^3$ and at most $5\times10^{21}/cm^3$. The p-doped silicon oxide layer 20 may be an amorphous layer. In such an example, the p-doped silicon oxide layer 20 may be formed at low temperature of at most 200° C.

The amorphous silicon layer 30 is a first amorphous silicon layer which is formed on a front surface of the p-doped silicon oxide layer 20 and is in a substantially amorphous state. The amorphous silicon layer 30 includes dielectric layer 31 and n-type amorphous silicon layer 32.

The dielectric layer 31 is a first dielectric layer formed on the front surface of p-doped silicon oxide layer 20. In an example, the dielectric layer 31 a first intrinsic amorphous silicon layer that includes hydrogen and is in the amorphous state. In the present example, an intrinsic amorphous silicon layer denotes an amorphous semiconductor layer having an included p-type or n-type dopant concentration of at most $5\times10^{18}/cm^3$ or an amorphous semiconductor layer having, in a case where both p-type and n-type dopants are included, a difference between a p-type dopant concentration and an n-type dopant concentration, which is at most $5\times10^{18}/cm^3$. The dielectric layer 31 may be made sufficiently thin so as to reduce, as much as possible, the absorption of light. At the same time, the dielectric layer 31 may be made sufficiently thick so as to sufficiently passivate a front surface of silicon substrate 10. In an example, the dielectric layer 31 has a film thickness of at least 1 nm and at most 25 nm. Alternatively, the dielectric layer 31 has a film thickness of at least 5 nm and at most 10 nm.

In some embodiments, the dielectric layer 31 may not be the intrinsic amorphous silicon layer as described above, and may be a silicon oxide layer, a silicon nitride layer, or an aluminum oxide layer. Moreover, the dielectric layer 31 may not be present, and the n-type amorphous silicon layer 32 may be directly formed on the front surface of the p-doped silicon oxide layer 20.

The n-type amorphous silicon layer 32 is a first conductive amorphous silicon layer which is formed on the dielectric layer 31. The n-type amorphous silicon layer 32 includes n-type dopants of a same conductivity type as the silicon substrate 10, and is in a substantially amorphous state. In an example, the n-type amorphous silicon layer 32 includes an amorphous silicon semiconductor thin film including hydrogen. The n-type amorphous silicon layer 32 has a higher n-type dopant concentration in a film than the dielectric layer 31, and has an n-type dopant concentration of at least $1\times10^{20}/cm^3$. Examples of n-type dopants may include phosphorus (P). The n-type amorphous silicon layer 32 may be made sufficiently thin to reduce, as much as possible, the absorption of light. At the same time the n-type amorphous silicon layer 32 may be made sufficiently thick to effectively separate charge carriers generated in the silicon substrate 10 and to allow the transparent electrode 40 to efficiently collect the generated charge carriers. The n-type amorphous silicon layer 32 has an n-type dopant concentration that may gradually change concentration from a side of the p-doped silicon oxide layer 20 to a side of the transparent electrode 40.

The amorphous silicon layer 60 is a second amorphous silicon layer which is disposed on the second principal surface of silicon substrate 10 and is in a substantially amorphous state. The amorphous silicon layer 60 includes a dielectric layer 61 and a p-type amorphous silicon layer 62.

The dielectric layer 61 is a second dielectric layer formed on the second principal surface of the silicon substrate 10. In an example, the dielectric layer 61 is a second intrinsic amorphous silicon layer that includes hydrogen and is in an amorphous state. In an example, the dielectric layer 61, like the dielectric layer 31, has a film thickness of at least 1 nm and at most 25 nm. Alternatively, the dielectric layer 31 has a film thickness of at least 5 nm and at most 10 nm.

In some embodiments, the dielectric layer 61 may not be an intrinsic amorphous silicon layer as described above, and may be a silicon oxide layer, a silicon nitride layer, or an aluminum oxide layer. Alternatively or in addition, the dielectric layer 61 may not be present, and the p-type amorphous silicon layer 62 may be directly formed on the second principal surface of the silicon substrate 10.

The p-type amorphous silicon layer 62 is a second conductive amorphous silicon layer which is formed on the dielectric layer 61, includes p-type dopants, which is an opposite conductivity type of the silicon substrate 10, and is substantially in the amorphous state. The p-type amorphous silicon layer 62 includes, for example, an amorphous silicon semiconductor thin film including hydrogen. The p-type amorphous silicon layer 62 has a higher p-type dopant concentration in a film than the dielectric layer 61, and preferably has a p-type dopant concentration of at least $1\times10^{20}/cm^3$. Examples of p-type dopants may include boron (B). The p-type amorphous silicon layer 62 may be made sufficiently thin to reduce, as much as possible, the absorption of light. At the same time, the p-type amorphous silicon layer 62 may be made sufficiently thick to effectively separate charge carriers generated in the silicon substrate 10 and to allow the transparent electrode 70 to efficiently collect the generated charge carriers. The p-type amorphous silicon layer 62 has a p-type dopant concentration that may gradually change from a side of the silicon substrate 10 to a side of the transparent electrode 70.

Each of the amorphous silicon layer 30, the amorphous silicon layer 60, the n-type amorphous silicon layer 32, and the p-type amorphous silicon layer 62 may include a microcrystal.

The transparent electrode 40 is formed on a front surface of amorphous silicon layer 30, and collects charge carriers in the n-type amorphous silicon layer 32. Moreover, the transparent electrode 70 is formed on a back surface of the amorphous silicon layer 60, and collects charge carriers in the p-type amorphous silicon layer 62. In an example, each of the transparent electrodes 40 and 70 may include a transparent conductive oxide such as indium tin oxide (ITO).

In some embodiments, determining which of the first principal surface and the second principal surface of silicon substrate 10 is used as a light-receiving surface (surface which mainly introduces light from the outside) is optional.

Moreover, although the conductivity type of the silicon substrate 10 has been described as having the n-type in one or more embodiments, in some embodiments, the conductivity type of the silicon substrate 10 may be the p-type. In such an example, in a condition in which the silicon substrate 10 is of a p-type, the p-type amorphous silicon layer 62 of the amorphous silicon layer 60 has the same conductivity type as the conductivity type of the silicon substrate 10. Thus, the amorphous silicon layer 60 is the first amorphous silicon layer. In addition, the n-type amorphous silicon layer 32 of the amorphous silicon layer 30 has a conductivity type opposite of the conductivity type of the silicon substrate 10, and thus the amorphous silicon layer 30 is the second amorphous silicon layer.

Moreover, although the solar cell 1 in accordance with one or more embodiments has been described as a bifacial solar cell including the transparent electrode 70 disposed also on a side of a second principal surface, the solar cell 1 may be a unifacial solar cell including, instead of the transparent electrode 70, a metal electrode that is not transparent.

Figure 5:
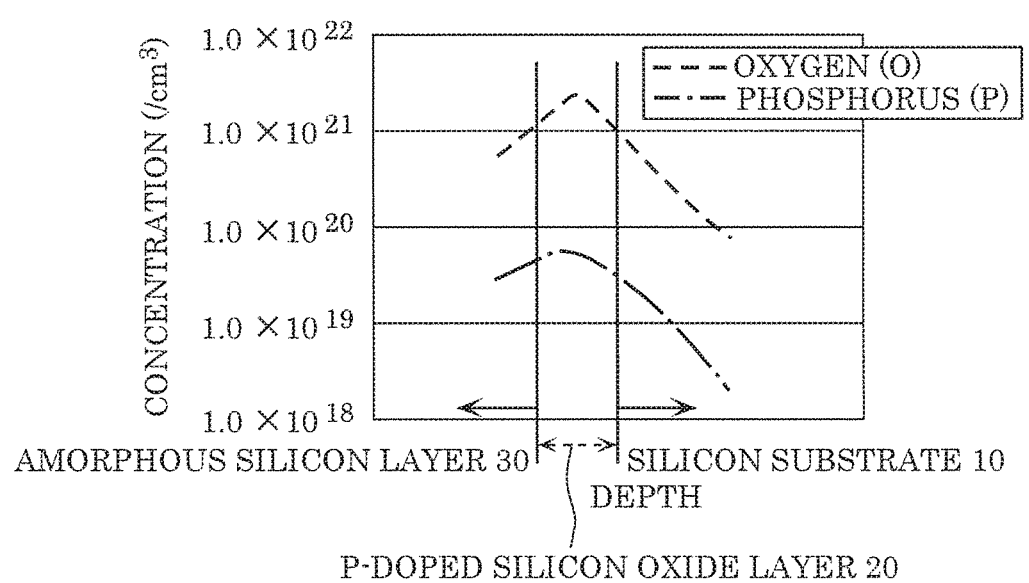
FIG. 5 is a graph illustrating concentration profiles of oxygen and phosphorus with respect to a depth direction from a silicon substrate to an amorphous silicon layer.

FIG. 5 is a graph illustrating concentration profiles of oxygen and phosphorus with respect to a depth direction from the amorphous silicon layer 30 to the silicon substrate 10. In the graph of FIG. 5, concentrations of oxygen and phosphorus are measured by secondary ion mass spectroscopy (SIMS) in a direction (depth direction) from the amorphous silicon layer 30 to the silicon substrate 10. Reviewing the graph of FIG. 5 reveals that absolute maximum points of an oxygen atomic concentration and a phosphorus atomic concentration are present in the depth direction and are located at the same depth. FIG. 5 further reveals that the oxygen atomic concentration is higher than the phosphorus atomic concentration by at least one order of magnitude at the maxima. Accordingly, the illustrated characteristics are produced according to a silicon oxide layer including phosphorus as an impurity (p-doped silicon oxide layer 20) between amorphous silicon layer 30 and silicon substrate 10. As may be obvious from a review of the graph in FIG. 5, the p-doped silicon oxide layer 20 has an atomic concentration of phosphorus of at least $1\times10^{19}/cm^3$ and at most $5\times10^{20}/cm^3$, and an atomic concentration of oxygen of at least $1\times10^{21}/cm^3$ and at most $2\times10^{22}/cm^3$.

In a conventional photoelectric conversion device, setting an impurity concentration of a silicon substrate in a heterojunction between a crystalline silicon substrate and an amorphous silicon layer to be a predetermined amount makes it possible to reduce recombination of charge carriers in a junction interface. As a result of the conventional impurity concentration setting, improvement an open-circuit voltage (Voc) is expected. However, the introduction of an impurity (e.g., phosphorus) into a front surface of the silicon substrate causes defects in the front surface, which make it impossible to completely reduce recombination of charge carriers in the amorphous silicon layer. Moreover, by increasing the impurity concentration of a silicon substrate to further improve photoelectric conversion characteristics, a reduction in an electric field strength of the amorphous silicon layer may be achieved. Consequently, the recombination of the charge carriers in the amorphous silicon layer is increased. Furthermore, recombination may be accelerated via the introduction of excessive impurities in the amorphous silicon layer. In other words, introducing an impurity into the front surface of the silicon substrate only cannot completely reduce the recombination of the charge carriers in the amorphous silicon layer. In addition, an excessive concentration of impurities in the front surface of the silicon substrate increases the defects in the front surface of the silicon substrate, and thus deteriorates the photoelectric conversion characteristics.

In contrast, with the solar cell 1 in accordance with one or more embodiments, a silicon oxide layer is disposed between amorphous silicon layer 30 and silicon substrate 10, and the silicon dioxide layer is doped with phosphorus. Stated differently, the p-doped silicon oxide layer 20 including phosphorus as the impurity is disposed between amorphous silicon layer 30 and silicon substrate 10.

In order to improve an open-circuit voltage, it may be advantageous to maintain a high degree of amorphousness of the amorphous silicon layer 30 in addition to reducing recombination of charge carriers caused by impurity doping. From this perspective, disposing a silicon oxide layer between the amorphous silicon layer 30 and the silicon substrate 10 makes it possible to suppress, in the amorphous silicon layer 30, epitaxial growth reflecting crystallinity of the silicon substrate 10. Moreover, in a condition in which, instead of an impurity, the p-doped silicon oxide layer 20 is disposed in the junction interface, it becomes possible to reduce the increasing of the defects in the front surface of the silicon substrate 10 and to thereby improve the open-circuit voltage.

In sum, with the solar cell 1 in accordance with one or more embodiments, disposing the silicon oxide layer including phosphorus as the impurity between the amorphous silicon layer 30 and the silicon substrate 10 makes it possible to reduce the recombination of the charge carriers in the interface and suppress the epitaxial growth in the amorphous silicon layer 30. Accordingly, since it is possible to ameliorate field effect, an improvement in the open-circuit voltage, which is not possible from merely doping impurities into the silicon substrate, can be achieved. Alternatively or in addition, it is possible to improve the open-circuit voltage without degrading the photoelectric conversion performance that depends on the defects in the front surface of the silicon substrate.

3. Structure of Solar Cell According to Variation

Figure 6:
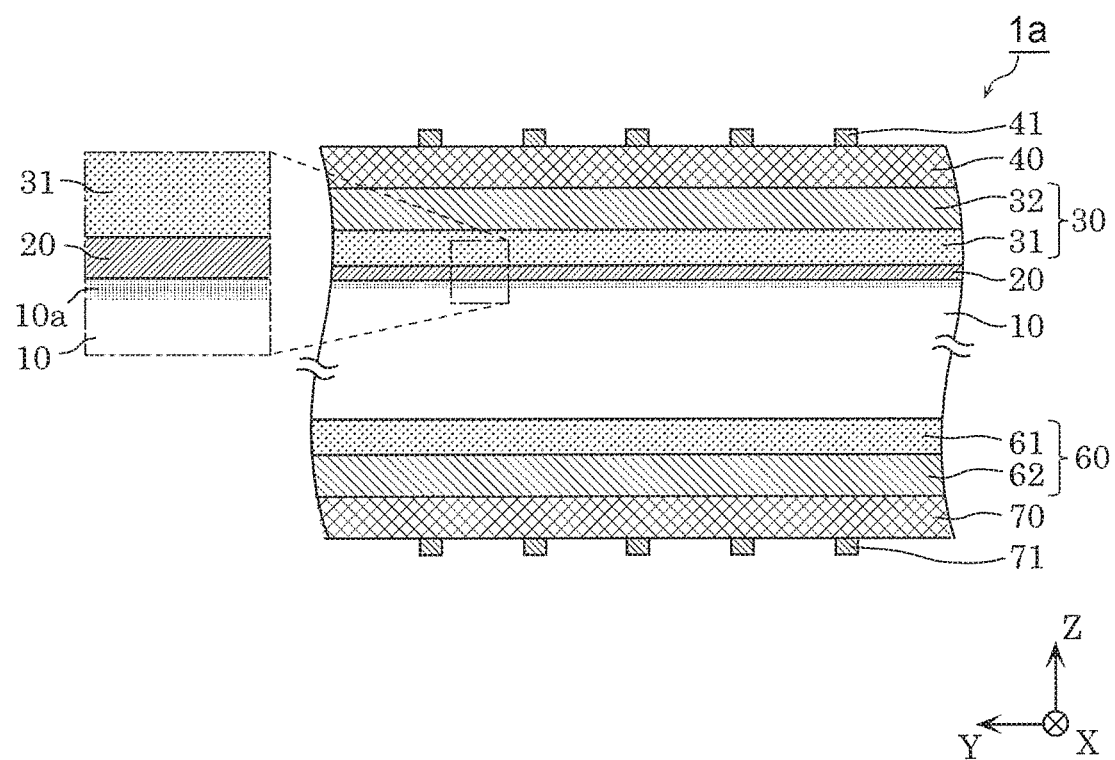
FIG. 6 is a diagram illustrating a schematic cross-sectional view of a laminated structure of a solar cell in accordance with variations of one or more embodiments or alternative embodiments.

FIG. 6 is a diagram illustrating a schematic cross-sectional view of a laminated structure of a solar cell 1a in accordance with a variation of one or more embodiments. As illustrated in FIG. 6, the solar cell 1a differs from the solar cell 1 in accordance with one or more embodiments in that diffusion region 10a of phosphorus is in a front surface (first principal surface) of the silicon substrate 10. In other words, in solar cell 1a according to a variation, the silicon substrate 10 has, in the first principal surface, the diffusion region 10a including phosphorus as an impurity. In this regard, however, the diffusion region 10a has a phosphorus atomic concentration lower than a phosphorus atomic concentration of the p-doped silicon oxide layer 20. Moreover, in an example, the diffusion region 10a may have an atomic concentration of phosphorus of at least $5 \times 10^{16}/cm^3$ and at most $5 \times 10^{20}/cm^3$, which is higher than an n-type dopant concentration of the silicon substrate 10. Furthermore, in an example, a depth of the diffusion region 10a from the front surface of silicon substrate 10 is at most 1.5 μm. In the example configuration, the p-doped silicon oxide layer 20 is between the amorphous silicon layer 30 and the silicon substrate 10. Thus, it is possible to reduce recombination of charge carriers on a side of the first principal surface of the silicon substrate 10 and to suppress epitaxial growth in the amorphous silicon layer 30. Accordingly, an improvement in the open-circuit voltage may be achieved. In the described example, a diffusion region of phosphorus may be in a second principal surface of the silicon substrate 10.

In addition, the diffusion region in a variation is not limited to a region formed using a thermal diffusion method. Examples of methods of formation of the diffusion region in the variation may include forming the diffusion region using a plasma doping method, an epitaxial growth method, an ion implantation method, or other methods.

4. Method for Manufacturing Solar Cell

Next, a method for manufacturing the solar cell 1 including the characteristics of the above described p-doped silicon oxide layer 20, will be described.

First, the silicon substrate 10 is washed, placed in a vacuum chamber, and heated to at most 200° C. to remove, as much as possible, moisture on a front surface of the silicon substrate 10.

Next, a hydrogen gas is introduced into the vacuum chamber, and the front surface of the silicon substrate 10 is cleaned by plasma discharge. The plasma discharge cleaning process has an additional effect of reducing an amount of carbon of the surface of the silicon substrate 10.

Next, the p-doped silicon oxide layer 20, the dielectric layer 31 (first intrinsic amorphous silicon layer), and the n-type amorphous silicon layer 32 are sequentially formed on the first principal surface of the silicon substrate 10. In an example, layers are formed on the first principal surface of the silicon substrate 10 after a front surface thereof has been cleaned, by chemical vapor deposition (CVD). The p-doped silicon oxide layer 20 is formed by introducing, into a vacuum deposition chamber, a silicon-containing gas such as silane ($SiH_4$), an n-type dopant-containing gas such as phosphine ($PH_3$), and an oxygen-containing gas such as $O_2$, $H_2O$, and $CO_2$, for example. The dielectric layer 31 (first intrinsic amorphous silicon layer) is formed by introducing, into the vacuum deposition chamber, the silicon-containing gas such as silane ($SiH_4$). The n-type amorphous silicon layer 32 is formed by introducing, into the vacuum deposition chamber, a silane ($SiH_4$) gas and the n-type dopant-containing gas such as phosphine ($PH_3$).

Next, the dielectric layer 61 (second intrinsic amorphous silicon layer) and the p-type amorphous silicon layer 62 are sequentially formed on the second principal surface of the silicon substrate 10. In an example, the layers may be formed by CVD. The dielectric layer 61 (second intrinsic amorphous silicon layer) is formed by introducing, into the vacuum deposition chamber, the silicon-containing gas such as silane ($SiH_4$) gas. The p-type amorphous silicon layer 62 is formed by introducing, into the vacuum deposition chamber, silane ($SiH_4$) gas and a p-type dopant-containing gas such as diborane ($B_2H_6$).

In some examples, the gases introduced in each of the manufacturing steps may be gases diluted with hydrogen gas, or other gas suitable for dilution.

Through the above steps, the p-doped silicon oxide layer 20 and the amorphous silicon layer 30 are formed on the first principal surface of the silicon substrate 10, and the amorphous silicon layer 60 is formed on the second principal surface of the silicon substrate 10.

Next, the transparent electrode 40 is formed on a front surface of the amorphous silicon layer 30, and the transparent electrode 70 is formed on a back surface of the amorphous silicon layer 60. Specifically, a transparent conductive oxide such as indium tin oxide (ITO) is deposited as a film on each of a front surface of the n-type amorphous silicon layer 32 and a back surface of the p-type amorphous silicon layer 62 by vapor deposition, sputtering, etc.

Finally, the collector electrode 43 (metal electrode) including the finger electrodes 41 is formed on the transparent electrode 40, and a collector electrode (metal electrode) including the finger electrodes 71 is formed on transparent electrode 70. In an example, the collector electrodes may be formed by a printing method such as a screen printing method with a thermosetting resin conductive paste using a resin material as a binder and conductive particles such as silver particles as a filler.

Thus, the solar cell 1 in accordance with one or more embodiments may be formed through the above steps.

In the aforementioned method for manufacturing the solar cell 1, the silicon substrate 10 may again be washed and cleaned by plasma discharge after the n-type amorphous silicon layer 32 is formed and before the dielectric layer 61 is formed.

Moreover, a textured structure having pyramids two-dimensionally arranged, may be previously formed in at least one of the first principal surface and the second principal surface of the silicon substrate 10. Specifically, the silicon substrate 10 is soaked in an etching solution. In an example, the etching solution is an alkaline aqueous solution including at least one of sodium hydroxide (NaOH), potassium hydroxide (KOH), and tetramethyl ammonium hydroxide (TMAH). In an example, the first principal surface and the second principal surface of the silicon substrate 10 are anisotropically etched along a (111) plane by soaking a (100) plane of the silicon substrate 10 in the above alkaline aqueous solution. As a result, a textured structure in which square pyramids are two-dimensionally arranged is formed in each of the first principal surface and the second principal surface of the silicon substrate 10.

Forming ridges and troughs referred to as the textured structure in which the pyramids are two-dimensionally arranged in the light-receiving surface of the solar cell 1 makes it possible to increase light entering inside the solar cell 1 by reducing reflected light and to raise power generation efficiency of the solar cell 1.

5. Advantageous Effects Etc.

The solar cell 1 in accordance with one or more embodiments includes: the silicon substrate 10 which is crystalline and has a first conductivity type (n-type); the p-doped silicon oxide layer 20, which is disposed on the first principal surface of the silicon substrate 10, and includes phosphorus as the impurity; and the amorphous silicon layer 30 disposed on p-doped silicon oxide layer 20.

With a conventional photoelectric conversion device, setting an impurity concentration of a silicon substrate in a heterojunction between a crystalline silicon substrate and an amorphous silicon layer to be a predetermined amount makes it possible to reduce recombination of charge carriers in a junction interface. As a result, an improvement in an open-circuit voltage (Voc) is expected. However, the introduction of an impurity (phosphorus) into a front surface of the silicon substrate causes defects in the front surface, which make it impossible to completely reduce recombination of charge carriers in the amorphous silicon layer. Moreover, by increasing the impurity concentration of the silicon substrate to further improve photoelectric conversion characteristics, a reduction in an electric field strength of the amorphous silicon layer may result. Consequently, the recombination of the charge carriers in the amorphous silicon layer is increased. Furthermore, recombination may be accelerated via introduction of the excessive impurities in the amorphous silicon layer. In other words, introducing an impurity into the front surface of the silicon substrate only cannot completely reduce the recombination of the charge carriers in the amorphous silicon layer. In addition, an excessive concentration of impurities in the front surface of the silicon substrate increases the defects in the front surface of the silicon substrate, and thus deteriorates the photoelectric conversion characteristics.

In contrast, with the solar cell 1 in accordance with one or more embodiments, a silicon oxide layer is disposed between amorphous silicon layer 30 and silicon substrate 10, and the silicon oxide layer includes phosphorus. Stated differently, the p-doped silicon oxide layer 20 including phosphorus as an impurity is disposed between the amorphous silicon layer 30 and the silicon substrate 10.

In order to improve an open-circuit voltage (Voc) of the solar cell 1, it may be advantageous to maintain a high degree of amorphousness of the amorphous silicon layer 30. From this perspective, disposing the silicon oxide layer 20 between the amorphous silicon layer 30 and the silicon substrate 10 makes it possible to suppress, in the amorphous silicon layer 30, epitaxial growth reflecting crystallinity of the silicon substrate 10. Moreover, the p-doped silicon oxide layer 20 is disposed therebetween, and thus it is possible to reduce the increasing of the defects in the front surface of the silicon substrate 10, making it also possible to improve the open-circuit voltage.

In sum, with the solar cell 1 in accordance with one or more embodiments, disposing the p-doped silicon oxide layer 20 between the amorphous silicon layer 30 and the silicon substrate 10 makes it possible to reduce the recombination of the charge carriers in the interface and suppress the epitaxial growth in the amorphous silicon layer 30. Accordingly, the improvement of the open-circuit voltage which cannot be achieved by merely doping impurity elements into the silicon substrate 10 can be achieved, or it is possible to improve the open-circuit voltage without degrading photoelectric conversion performance which depends on the defects in the front surface of the silicon substrate 10.

Moreover, the amorphous silicon layer 30 may include: the dielectric layer 31 (first intrinsic amorphous silicon layer) which is substantially intrinsic and disposed on the front surface of the p-doped silicon oxide layer 20; and the n-type amorphous silicon layer 32 which is disposed on a front surface of the dielectric layer 31 and includes a first conductivity type (n-type) dopant.

With this, the dielectric layer 31 (first intrinsic amorphous silicon layer) is between the silicon substrate 10 and the n-type amorphous silicon layer 32. As a result, the recombination of the charge carriers in the junction interface may be reduced, which makes it possible to promote movement of the charge carriers.

Furthermore, in the p-doped silicon oxide layer 20, a phosphorus atomic concentration may be at least $1\times10^{19}/\text{cm}^3$ and at most $5\times10^{20}/\text{cm}^3$, and an oxygen atomic concentration may be at least $1\times10^{21}/\text{cm}^3$ and at most $2\times10^{22}/\text{cm}^3$.

In addition, in the p-doped silicon oxide layer 20, the atomic concentration of phosphorus may be at least $5\times10^{19}/\text{cm}^3$ and at most $1\times10^{20}/\text{cm}^3$, and the atomic concentration of oxygen may be at least $2\times10^{21}/\text{cm}^3$ and at most $5\times10^{21}/\text{cm}^3$.

Since the atomic concentration of oxygen is higher than the atomic concentration of phosphorus, the p-doped silicon oxide layer 20 has a structure in which phosphorus is doped to the silicon oxide as the impurity. With this, it is possible to reduce the recombination of the charge carriers in the above interface and suppress the epitaxial growth in the amorphous silicon layer 30. Accordingly, the improvement of the photoelectric conversion characteristics which cannot be achieved by merely doping impurity elements into the silicon substrate 10 can be achieved, or it is possible to improve the open-circuit voltage without degrading photoelectric conversion performance which depends on the defects in the front surface of the silicon substrate 10.

Moreover, the silicon substrate 10 may include, in the first principal surface, the diffusion region 10*a* having a higher phosphorus atomic concentration than the silicon substrate 10.

Even with this configuration, the p-doped silicon oxide layer 20 is between the amorphous silicon layer 30 and the silicon substrate 10, and thus it is possible to reduce the recombination of the charge carriers on the side of the first principal surface of the silicon substrate 10 and suppress the epitaxial growth in the amorphous silicon layer 30. Accordingly, it is possible to achieve an improvement of the open-circuit voltage.

Moreover, the solar cell 1 may further include the amorphous silicon layer 60 which is disposed on a second principal surface which is back to back with the first principal surface of the silicon substrate 10.

Furthermore, the amorphous silicon layer 60 may include: the dielectric layer 61 (second intrinsic amorphous silicon layer) which is substantially intrinsic and disposed on the second principal surface of the silicon substrate 10; and the p-type amorphous silicon layer 62 which is disposed on a back surface of the dielectric layer 61 and includes a dopant of a second conductivity type (p-type).

The dielectric layer 61 (second intrinsic amorphous silicon layer) is between the silicon substrate 10 and the p-type amorphous silicon layer 62. As a result, the recombination of the charge carriers in the junction interface may be reduced, which makes it possible to promote movement of the charge carriers.

Moreover, the solar cell module 100 in accordance with one or more embodiments includes: a plurality of cells of the solar cells 1 which are two-dimensionally arranged; the front surface protective member 180*a* disposed on a front surface side of the cells of the solar cells 1; back surface protective member 180*b* disposed on a back surface side of the cells of the solar cells 1; the front surface encapsulant member 170*a* disposed between the cells of the solar cells 1 and the front surface protective member 180*a*; and the back surface encapsulant member 170*b* disposed between the cells of the solar cells 1 and the back surface protective member 180*b*.

With this, it is possible to reduce the recombination of the charge carriers in the semiconductor junction interface between the silicon substrate 10 which is crystalline and the amorphous silicon layer 30, and to suppress the epitaxial growth in the amorphous silicon layer 30. Thus, the open-circuit voltage of the cells of the solar cells 1 may be improved, which makes it possible to raise the power generation efficiency of the solar cell module 100.

(Other Embodiments)

Although solar cell 1 and solar cell module 100 according to the present disclosure have been described above based on the aforementioned one or more embodiments, the present disclosure is not limited to the aforementioned one or embodiments.

For example, although, in the solar cell module 100 according to the aforementioned one or more embodiments, the cells of the solar cells 1 are arranged in a matrix, the arrangement is not limited to a matrix. For example, the arrangement may be circular, linear, or curvilinear.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell comprising:
   a single-crystalline silicon substrate;
   a first silicon oxide layer disposed on a first principal surface of the single-crystalline silicon substrate and including phosphorus as an impurity;
   a first dielectric layer disposed on the first silicon oxide layer;
   a first conductivity type amorphous silicon layer disposed on the first dielectric layer and including a dopant of a first conductivity type;
   a second dielectric layer disposed on a second principal surface of the single-crystalline silicon substrate; and
   a second conductivity type amorphous silicon layer disposed on the second dielectric layer and including a dopant of a second conductivity type which is opposite of the first conductivity type, wherein
   the first conductivity type amorphous silicon layer, the first dielectric layer, the first silicon oxide layer, the single-crystalline silicon substrate, the second dielectric layer and the second conductivity type amorphous silicon layer are stacked in the recited order.

2. The solar cell according to claim 1, wherein
   the first dielectric layer comprises a first intrinsic dielectric layer being substantially intrinsic.

3. The solar cell according to claim 1, wherein
   the first dielectric layer comprises one of a silicon oxide layer, a silicon nitride layer, and an aluminum oxide layer.

4. The solar cell according to claim 1, wherein
   the first conductivity type amorphous silicon layer comprises a microcrystal.

5. The solar cell according to claim 1, wherein
   the single-crystalline silicon substrate comprises, in the first principal surface, a diffusion region having a first phosphorus concentration higher than that of a second phosphorous concentration of a region of the single-crystalline silicon substrate other than the first principal surface.

6. The solar cell according to claim 5, wherein
   the first phosphorus concentration of the diffusion region is lower than a phosphorus concentration of the first silicon oxide layer.

7. The solar cell according to claim 1, wherein
   a concentration profile of phosphorus in a depth direction from the first conductivity type amorphous silicon layer to the single-crystalline silicon substrate has a maximum point at a region of the first silicon oxide layer.

8. The solar cell according to claim 1, wherein
   a concentration profile of oxygen in a depth direction from the first conductivity type amorphous silicon layer to the single-crystalline silicon substrate has a maximum point at a region of the first silicon oxide layer.

9. A solar cell module comprising:
   a plurality of solar cells according to claim 1, which is two-dimensionally arranged;
   a front surface protective member disposed on a front surface side of the plurality of solar cells;
   a back surface protective member disposed on a back surface side of the plurality of solar cells;

a front surface encapsulant member disposed between the plurality of solar cells and the front surface protective member; and a back surface encapsulant member disposed between the plurality of solar cells and the back surface protective member.

10. A solar cell comprising:

a single-crystalline silicon substrate;

a first silicon oxide layer disposed on a back surface of the single-crystalline silicon substrate and including phosphorus as an impurity;

a first dielectric layer disposed on the first silicon oxide layer; and a first conductivity type amorphous silicon layer disposed on the first dielectric layer and including a p-type dopant, wherein the first dielectric layer is between the first silicon oxide layer and the first conductivity type amorphous silicon layer, and the first dielectric layer is in direct contact with the first silicon oxide layer and the first conductivity type amorphous silicon layer.

11. The solar cell according to claim 10, wherein
the first dielectric layer comprises a first intrinsic dielectric layer being substantially intrinsic.

12. The solar cell according to claim 10, wherein
the first dielectric layer comprises one of a silicon oxide layer, a silicon nitride layer, and an aluminum oxide layer.

13. The solar cell according to claim 10, wherein
the first conductivity type amorphous silicon layer comprises a microcrystal.

14. The solar cell according to claim 10, wherein
the single-crystalline silicon substrate comprises, in the back surface, a diffusion region having a first phosphorus concentration higher than a second phosphorous concentration of a region of the single-crystalline silicon substrate other than the back surface.

15. The solar cell according to claim 14, wherein
the first phosphorus concentration of the diffusion region is lower than a phosphorus concentration of the first silicon oxide layer.

16. The solar cell according to claim 10, wherein
a concentration profile of phosphorus in a depth direction from the first conductivity type amorphous silicon layer to the single-crystalline silicon substrate has a maximum point at a region of the first silicon oxide layer.

17. The solar cell according to claim 10, wherein
a concentration profile of oxygen in a depth direction from the first conductivity type amorphous silicon layer to the single-crystalline silicon substrate has a maximum point at a region of the first silicon oxide layer.

18. A solar cell module comprising:

a plurality of solar cells according to claim 10, which is two-dimensionally arranged;

a front surface protective member disposed on a front surface side of the plurality of solar cells;

a back surface protective member disposed on a back surface side of the plurality of solar cells;

a front surface encapsulant member disposed between the plurality of solar cells and the front surface protective member; and a back surface encapsulant member disposed between the plurality of solar cells and the back surface protective member.

19. The solar cell according to claim 1, wherein
the first silicon oxide layer is thinner than the first dielectric layer and the first conductivity type amorphous silicon layer, the first silicon oxide layer has a film thickness of at least 0.1 nm and at most 3 nm, the first dielectric layer has a film thickness of at least 1 nm and at most 25 nm, and the second dielectric layer has a film thickness of at least 1 nm and at most 25 nm.

* * * * *